(12) United States Patent
Kyomasu et al.

(10) Patent No.: US 6,863,206 B2
(45) Date of Patent: Mar. 8, 2005

(54) BONDING APPARATUS

(75) Inventors: Ryuichi Kyomasu, Kodaira (JP); Yasushi Suzuki, Oume (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 99 days.

(21) Appl. No.: 10/404,624

(22) Filed: Apr. 1, 2003

(65) Prior Publication Data
US 2003/0183672 A1 Oct. 2, 2003

(30) Foreign Application Priority Data

Apr. 2, 2002 (JP) ....................................... 2002-100316

(51) Int. Cl.$^7$ ................................................. B23K 1/06
(52) U.S. Cl. .......................... 228/1.1; 228/4.5; 228/45
(58) Field of Search .......................... 228/1.1, 4.5, 45, 228/180.5, 262; 156/73.2, 580.1, 580.2; 29/740, 748

(56) References Cited

U.S. PATENT DOCUMENTS

| | | | | |
|---|---|---|---|---|
| 5,615,821 A | * | 4/1997 | Sasano | 228/102 |
| 5,971,248 A | * | 10/1999 | Koduri | 228/4.5 |
| 6,282,780 B1 | * | 9/2001 | Waki et al. | 29/840 |
| 6,398,098 B1 | * | 6/2002 | Kada | 228/4.5 |
| 6,474,538 B1 | * | 11/2002 | Yonezawa et al. | 228/262 |

FOREIGN PATENT DOCUMENTS

| | | |
|---|---|---|
| JP | 04-317343 (3220483) | 11/1992 |
| JP | 05-74838 (3220483) | 3/1993 |
| JP | 10-74785 (3220483) | 3/1998 |

* cited by examiner

Primary Examiner—Jonathan Johnson
(74) Attorney, Agent, or Firm—Koda & Androlia

(57) ABSTRACT

A bonding apparatus including an ultrasonic horn having a capillary, a horn holder holding the ultrasonic horn, a swing arm rotatably supporting the horn holder on horn holder supporting shafts, and auxiliary arms which are rotatably supported by auxiliary arm supporting shafts and rotatably supported by connecting shafts on the horn holder. The horn holder supporting shafts are disposed above a hypothetical center of an imaginary horizontal line extending from the tip end of the capillary, the auxiliary arm supporting shafts are disposed in the back of the horn holder supporting shafts and at the same height as the horn holder supporting shafts, and the connecting shafts are disposed at an intersection of an extension of an imaginary line connecting the tip end of the capillary and the horn holder supporting shafts and an extension of an imaginary line connecting the hypothetical center and the auxiliary arm supporting shafts.

1 Claim, 5 Drawing Sheets

BONDING APPARATUS

BACKGROUND OF THE INVENTION

1. Field of the Invention

The present invention relates to a bonding apparatus and more particularly to a bonding apparatus which is suitable for use in bonding of a workpiece that has a large bonding area.

2. Prior Art

Bonding apparatuses that perform bump formation, wire connections, etc. are generally divided into two types: a vertically driven type and a supporting-point swinging type.

In the vertically driven type, a slider is installed on a linear guide that has vertical guide parts so that this slider can move upward and downward, an ultrasonic horn which holds a capillary is attached to a horn holder, and the horn holder is fastened to the slider. This type of vertically driven type apparatus is described in, for instance, Japanese Patent No. 3220483 (corresponding to Japanese Patent Application Laid-Open No. 05-74838).

In the second type, which is the supporting-point swinging type, an ultrasonic horn holding a capillary is attached to a horn holder. The horn holder is caused to swing about the supporting point of a cruciform plate spring that supports the horn holder, or the horn holder is fastened to a supporting shaft which is rotatably supported; and the horn holder is caused to swing about this supporting shaft. This type of supporting-point swinging type apparatus is disclosed in, for instance, Japanese Patent Nos. 2814154 (corresponding to Japanese Patent Application Laid-Open No. 04-317343) and 2860650 (corresponding to Japanese Patent Application Laid-Open No. 10-74785).

In the vertically driven type, the length of the linear guide must be long enough so that the capillary contacts the workpiece, and the linear guide extends below the horizontal plane of the bonding surface of the workpiece. Accordingly, the workpiece is limited to a size that does not contact the linear guide. Furthermore, since the driven part is heavy since it includes the ultrasonic horn, horn holder, slider, etc., the inertia is large when the apparatus is driven upward and downward at a high speed. As a result, bonding of small balls is especially difficult.

In the second supporting-point swinging type, the capillary must be perpendicular to the workpiece in the state in which the capillary contacts the workpiece. Accordingly, the supporting point or supporting shaft that constitutes the center of rotation of the horn holder must be at the same height as the tip end of the capillary. Consequently, the horn holder and the supporting point or supporting shaft are positioned on the horizontal plane of the bonding surface of the workpiece, so that the size of the workpiece is limited as in the case of the above-described first vertically driven type. Furthermore, since the capillary swings about the supporting point or supporting shaft, correction in the forward-rearward direction (axial direction of the ultrasonic horn) is necessary in order to move the capillary upward and downward substantially perpendicularly.

SUMMARY OF THE INVENTION

Accordingly, the object of the present invention is to provide a bonding apparatus which makes it possible to move the capillary upward and downward in substantially perpendicular fashion with respect to the bonding surface and which allows bonding of a workpiece that has a large bonding area.

The above object is accomplished by a unique structure for a bonding apparatus that includes: an ultrasonic horn which holds a capillary at its end; a horn holder which holds the ultrasonic horn; a swing arm which supports the horn holder so that the horn holder is free to rotate, the swing arm being attached at its upper portion to a bonding head so that the swing arm is free to swing; auxiliary arms which are rotatably supported at their front ends by the bonding head and are ratatably supported at their rear portions by the horn holder; and a driving motor which drives the rear portion of the horn holder; and in the above structure, the center of rotation of the horn holder with respect to the swing arm is disposed on a substantially vertical line at a hypothetical center of the horizontal line extending from the tip end of the capillary, the center of rotation of the auxiliary arms with respect to the bonding head is disposed in the back of the center of rotation of the horn holder with respect to the swing arm and at substantially the same height as the center of rotation of the horn holder, and the center of rotation of the auxiliary arms with respect to the horn holder is disposed at an intersection point of:

an extension of a line connecting the tip end of the capillary and the center of rotation of the horn holder with respect to the swing arm, and an extension of a line connecting the hypothetical center and the center of rotation of the auxiliary arms with respect to the bonding head. head.

BRIEF DESCRIPTION OF THE DRAWINGS

FIGS. 6A and 6B illustrate the operating principle of the bonding apparatus of the present invention, in which FIG. 6A is a front view of the essential portion of the bonding apparatus of the present invention in a state in which the capillary is in contact with a workpiece, and FIG. 6B is a front view of the essential portion of the bonding apparatus of the present invention with the capillary raised;

DETAILED DESCRIPTION OF THE INVENTION

Figure 1A:
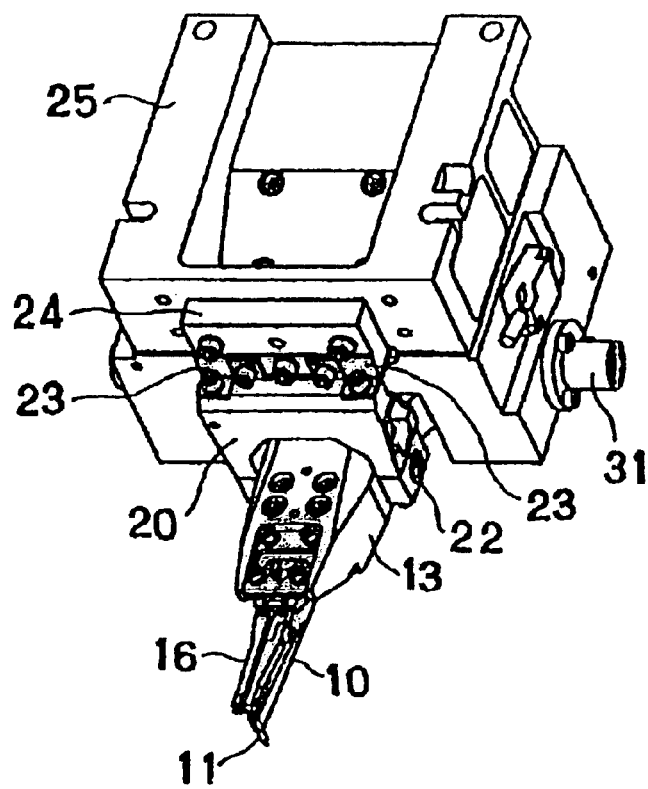
FIG. 1A is an external perspective view of one embodiment of the bonding apparatus of the present invention seen from above.
Figure 1B:
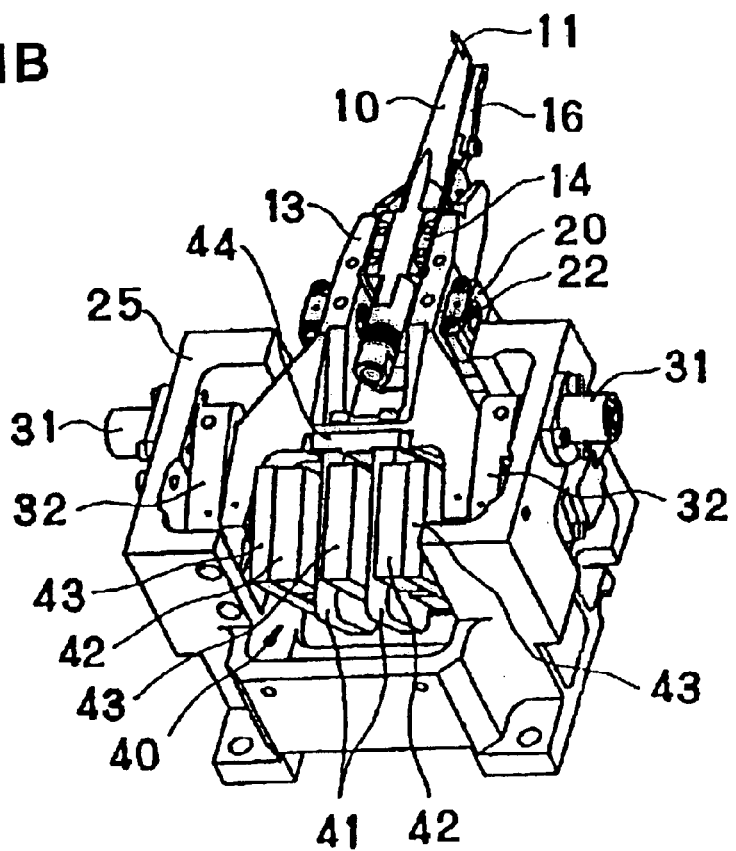
FIG. 1B is an external perspective view seen from the rear.
Figure 2:
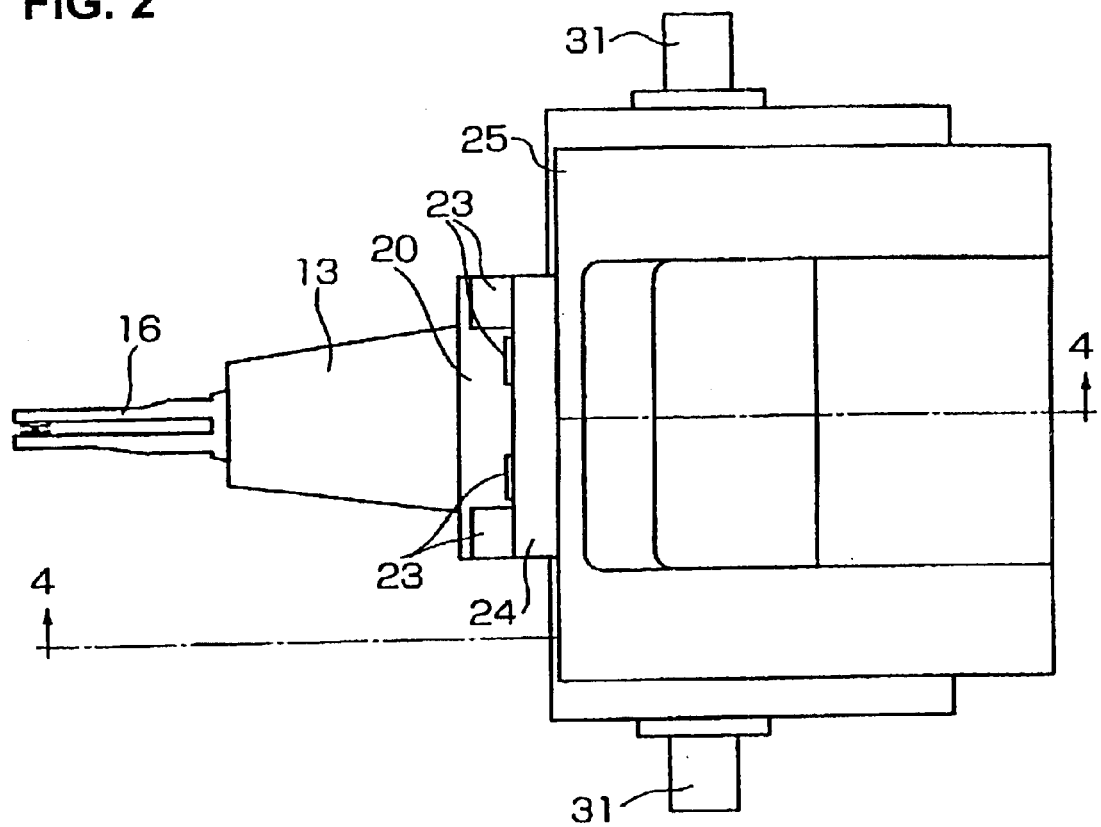
FIG. 2 is a top view of the embodiment of FIG. 1.
Figure 3:
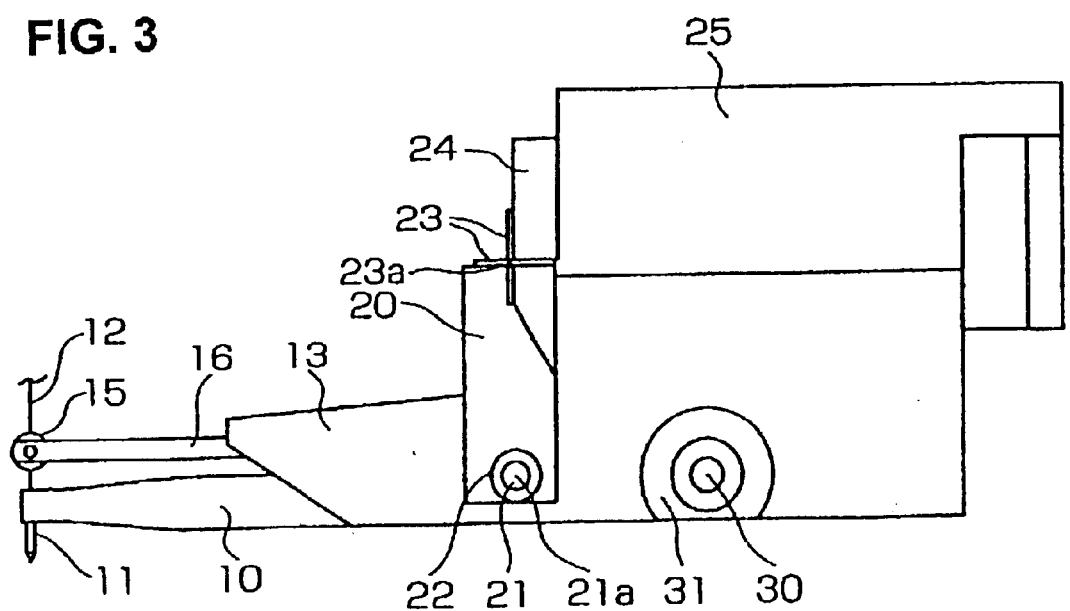
FIG. 3 is a front view thereof.
Figure 4:
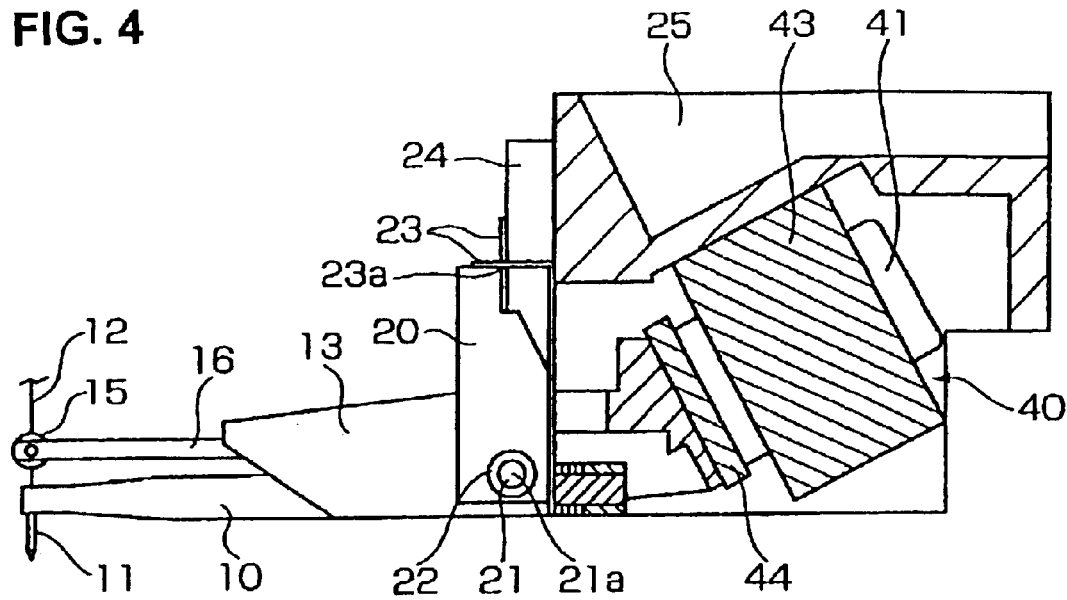
FIG. 4 is a partially sectional view taken along the line 4—4 in FIG. 2.
Figure 5:
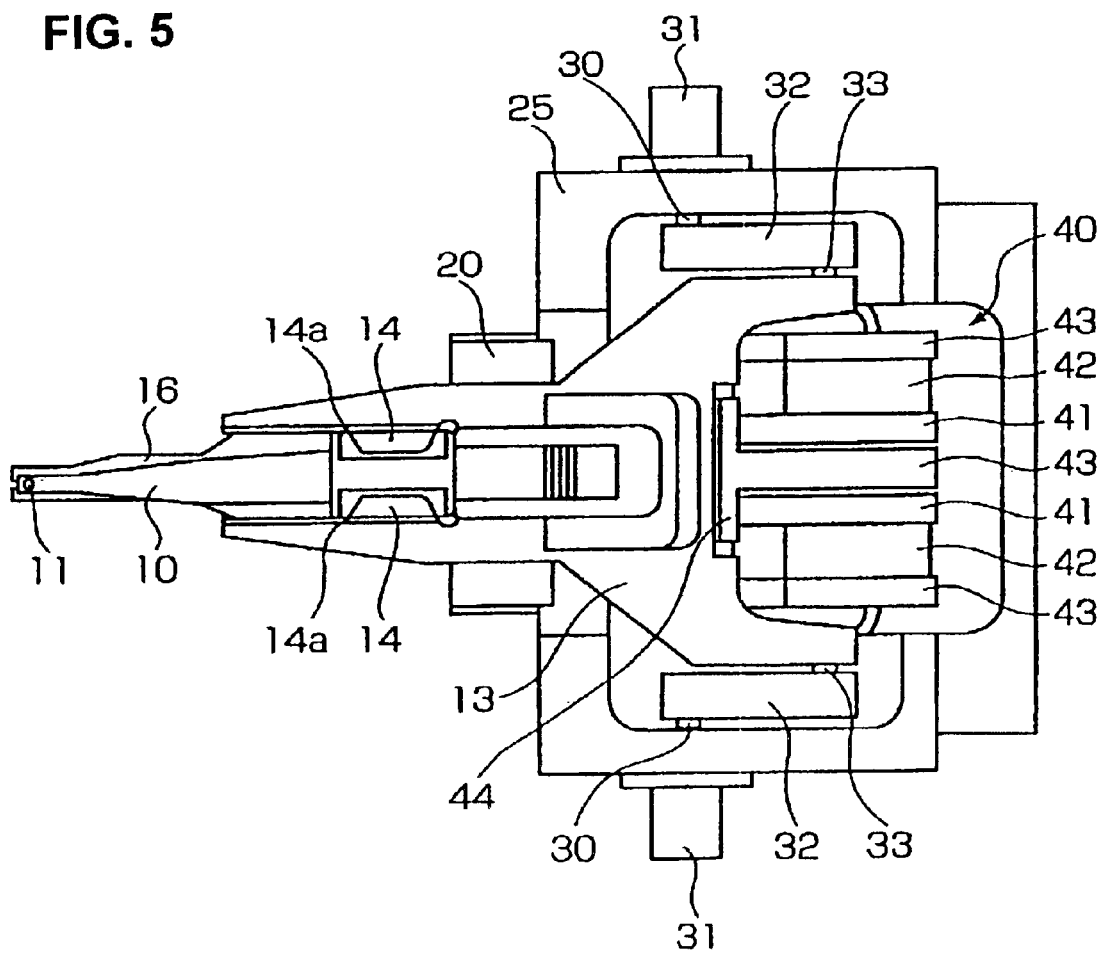
FIG. 5 is a back view of FIG. 2.

Embodiments of the bonding apparatus of the present invention will be described below with reference to the accompanying drawings.

As shown in FIG. 1 and FIGS. 3 through 5, a capillary 11 is fastened to the tip end portion of an ultrasonic horn 10, and a wire 12 which is wound on a wire spool (not shown) passes through the capillary 11. The ultrasonic horn 10 is disposed in a recess formed in the undersurface of a horn holder 13 and is fastened to the horn holder 13 via a connecting plate 14 which has a node part 14a that constitutes a node of vibration of the ultrasonic horn 10. Furthermore, a clamping arm 16 which has a wire damper 15 that holds the wire 12 is disposed above the ultrasonic horn 10, and this clamping arm 16 is fastened to the horn holder 13.

The horn holder 13 is disposed inside the bifurcate shape of a swing arm 20 which is open at the bottom, and horn holder supporting shafts 21 which are fastened to both side surfaces of the horn holder 13 are supported on the swing arm 20 via bearings 22 so that these horn holder supporting shafts 21 are rotatable. Both sides of the upper surface of the swing arm 20 are fastened to a fastening block 24 via cruciform plate springs 23, and the fastening block 24 is fastened to a bonding head 25. Accordingly, the swing arm 20 swings about the supporting points 23a of the cruciform plate springs 23.

Figure 6A:
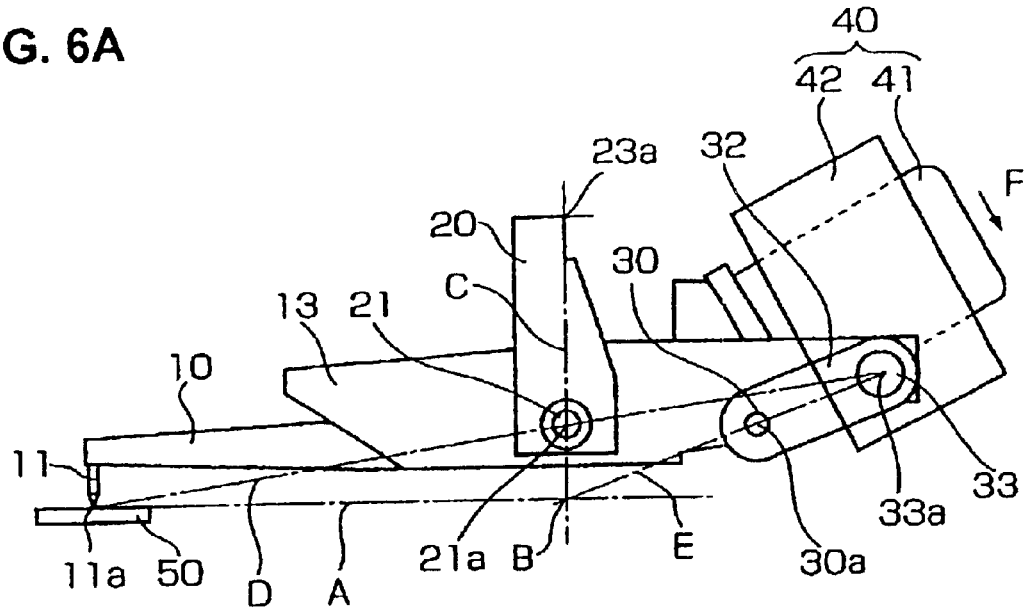

As shown in FIG. 6A, the centers 21a of the horn holder supporting shafts 21 are located on a (imaginary) vertical line C which is perpendicular to the hypothetical center B of the (imaginary) horizontal line A that extends from the capillary 11 at points above this hypothetical center B. The hypothetical center B is at a location where an imaginary vertical line extending from the supporting point 23a of the cruciform plate spring 23 and an imaginary horizontal line extending from the tip end of the capillary 11 intersect each other. Furthermore, although not shown in the accompanying drawings, the upper surface of the bonding head 25 is fastened to an XY table which is driven in the directions of the X and Y axes, and this XY table is fastened to the roof portion of the frame of the bonding apparatus.

Auxiliary arm supporting shafts 30 are supported via bearings 31 on both side surfaces of the bonding head 25 on the rear side of (or at positions behind) the horn holder supporting shafts 21 so that these auxiliary arm supporting shafts 30 are rotatable, and auxiliary arms 32 are fastened to the auxiliary arm supporting shafts 30. The auxiliary arms 32 are supported on the horn holder 13 via connecting shafts 33 so that the auxiliary arms 32 are rotatable. As seen from FIG. 6A, the centers 33a of the connecting shafts 33 (only one center 33a is shown) constitute the intersection points between an extension of a (imaginary) line D, which connects the tip end 11a of the capillary 11 and the horn holder supporting shafts 21, and an extension of a (imaginary) line E, which connects the hypothetical center B and the centers 30a of the auxiliary arm supporting shafts 30.

The rear portion of the horn holder 13 is driven by a driving motor 40. The driving motor 40 includes two coils 41, permanent magnets 42 which are disposed on the outsides of these coils 41, and yokes 43 which are respectively disposed on the outsides of the permanent magnets 42 and between the coils 41. The coils 41 are held by a coil holder 44, and the coil holder 44 is fastened to the central portion of the rear portion of the horn holder 13. The permanent magnets 42 and yokes 43 are fastened to the bonding head 25.

Next, the operation will be described.

Figure 6B:
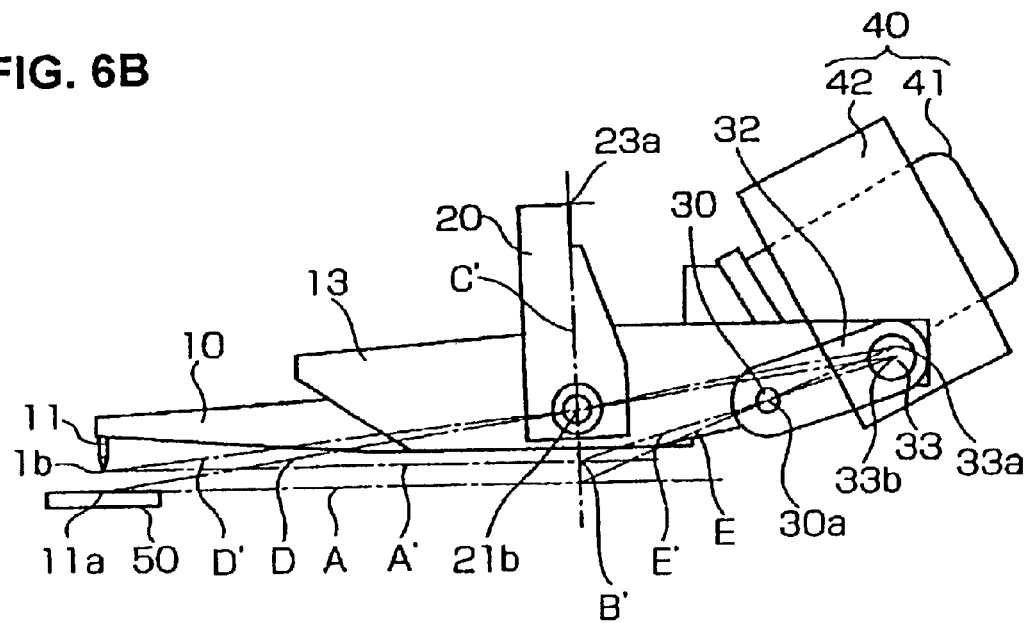

FIG. 6A shows a sate in which the capillary 11 is in contact with the bonding surface of the workpiece 50. In this state, an electric current is supplied to the coils 41 of the driving motor 40 in a direction that raises the capillary 11 by a fixed amount. As a result, the coils 41 are moved in the direction indicated by arrow F, and the auxiliary arms 32 supporting the rear portion of the horn holder 13 to which the coils 41 are attached swing in the direction indicated by arrow F about the centers 30a of the auxiliary arm supporting shafts 30; and as shown in FIG. 6B the centers 33a of the connecting shafts 33 are moved to the positions of the centers 33b. As these auxiliary arms 32 swing, the swing arm 20, which supports the horn holder 13 so that the horn holder 13 is rotatable, makes a circular arc motion about the supporting points 23a of the cruciform plate springs 23, so that the centers 21a of the horn holder supporting shafts 21 are moved to the positions of the centers 31b. As a result, the tip end 11a of the capillary 11 are raised to the position of the tip end 11b on an extension of a (imaginary) line D' that connects the centers 33b and centers 21b.

Figure 7:
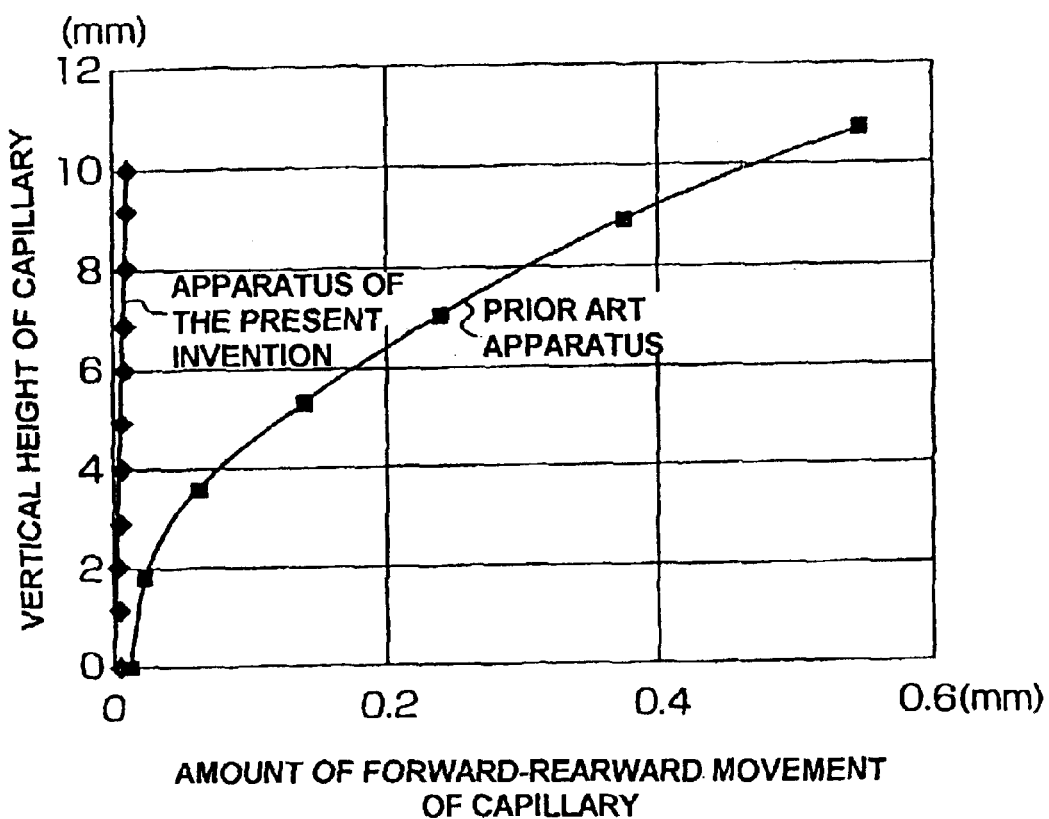
FIG. 7 is a comparative graph showing the amount of forward-rearward movement of the tip end of the capillary that accompanies the upward and downward movement of the capillary in the apparatus of the present invention and a conventional apparatus.

In this state, the point B', where an extension E' of a (imaginary) line connecting the centers 33b and the centers 30a of the auxiliary arm supporting shafts 30 and an extension of a (imaginary) line C' connecting the supporting points 23a and the centers 21b intersect, makes the hypothetical center of the vertical driving with respect to the tip end 11b of the capillary 11. Since the height of the hypothetical center B' in this case is substantially equal to the height of the tip end 11b of the capillary 11, the amount of movement in the direction of the Y axis (the axial direction of the ultrasonic horn 10) that accompanies the rise of the tip end of the capillary 11 is extremely small. In other words, the (imaginary) line A' connecting the hypothetical center B' and the tip end 11b of the capillary 11 is substantially parallel to the line A, and the capillary 11 is raised substantially vertically. As a result, as seen from FIG. 7, the amount of forward-rearward movement of the tip end of the capillary is extremely large in a conventional apparatus of the supporting-point swinging type but is extremely small in the apparatus of the present invention.

As seen from the above, the bonding apparatus of the present invention includes: the ultrasonic horn 10 which holds the capillary 11; the horn holder 13 which holds the ultrasonic horn 10; the swing arm 20 which ratatably supports the horn holder 13 on the horn holder supporting shafts 21 and is attached at its upper portion to a bonding head in a swingable fashion; auxiliary arms 32 which are rotatably supported, by auxiliary arm supporting shafts 30, on the bonding head and are also ratatably supported, by the connecting shafts 33, on the horn holder 13; and the driving motor 40 which drives the horn holder.

Furthermore, the center of rotation 21a of the horn holder 13 with respect to the swing arm 20 is disposed on substantially the vertical line C at a hypothetical center B on the horizontal line A that extends from the tip end 11a of the capillary 11, and the center of rotation 30a of the auxiliary arms 32 with respect to the bonding head 25 is disposed behind or in the back of the center of rotation 21a and at substantially the same height as this center of rotation 21a. Furthermore, the center of rotation 33a of the auxiliary arms 32 with respect to the horn holder 13 is disposed at an intersection point between the extension of line D, which connects the tip end 11a of the capillary 11 and the center of rotation 21a, and the extension of line E, which connects the hypothetical center B and the center of rotation 30a. Accordingly, the capillary 11 is moved upward and downward substantially perpendicularly with respect to the bonding surface, and thus a workpiece with a large bonding area can be bonded.

Also, the capillary 11 can be moved upward and downward substantially perpendicularly with respect to the bonding surface, and thus a workpiece with a large bonding area can be bonded in this aspect also.

What is claimed is:

1. A bonding apparatus comprising:

an ultrasonic horn which holds a capillary at one end thereof, a horn holder which holds said ultrasonic horn, a swing arm which supports in a rotatable fashion said horn holder, said swing arm being attached at an upper portion thereof to a bonding head so as to be swingable, auxiliary arms which are rotatably supported at front ends thereof by said bonding head and are rotatably supported at rear portions thereof by said horn holder, and a driving motor which drives a rear portion of said horn holder; wherein a center of rotation of said horn holder with respect to said swing arm is disposed above a hypothetical center of a horizontal line that extends from a tip end of said capillary, a center of rotation of said auxiliary arms with respect to said bonding head is disposed on a rear side of said center of rotation of said horn holder with respect to said swing arm and at substantially same height as said center of rotation of said horn holder; and a center of rotation of said auxiliary arms with respect to said horn holder is disposed at an intersection point of:

an extension of a line connecting said tip end of said capillary and said center of rotation of said horn holder with respect to said swing arm, and an extension of a line connecting said hypothetical center and said center of rotation of said auxiliary arms with respect to said bonding head.

* * * * *